United States Patent
Zaka et al.

(10) Patent No.: US 9,263,270 B2
(45) Date of Patent: Feb. 16, 2016

(54) METHOD OF FORMING A SEMICONDUCTOR DEVICE STRUCTURE EMPLOYING FLUORINE DOPING AND ACCORDING SEMICONDUCTOR DEVICE STRUCTURE

(71) Applicant: GLOBALFOUNDRIES Inc., Grand Cayman (KY)

(72) Inventors: Alban Zaka, Dresden (DE); Ran Yan, Dresden (DE); Nicolas Sassiat, Dresden (DE); El Mehdi Bazizi, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/911,857

(22) Filed: Jun. 6, 2013

(65) Prior Publication Data

US 2014/0361385 A1 Dec. 11, 2014

(51) Int. Cl.
| | |
|---|---|
| *H01L 21/4763* | (2006.01) |
| *H01L 21/265* | (2006.01) |
| *H01L 21/28* | (2006.01) |
| *H01L 29/51* | (2006.01) |
| *H01L 29/66* | (2006.01) |
| *H01L 29/78* | (2006.01) |
| *H01L 29/49* | (2006.01) |

(52) U.S. Cl.
CPC .......... *H01L 21/265* (2013.01); *H01L 21/2658* (2013.01); *H01L 21/28176* (2013.01); *H01L 29/51* (2013.01); *H01L 29/6659* (2013.01); *H01L 29/7833* (2013.01); *H01L 29/4916* (2013.01)

(58) Field of Classification Search
None
See application file for complete search history.

(56) References Cited

U.S. PATENT DOCUMENTS

| | | | |
|---|---|---|---|
| 4,748,131 A | 5/1988 | Zietlow | |
| 5,605,848 A | 2/1997 | Ngaoaram | |
| 5,683,946 A | 11/1997 | Lu et al. | |
| 5,712,208 A | 1/1998 | Tseng et al. | |
| 5,714,788 A | 2/1998 | Ngaoaram | |
| 5,726,087 A | 3/1998 | Tseng et al. | |
| 5,767,558 A | 6/1998 | Lo et al. | |
| 5,959,333 A | 9/1999 | Gardner et al. | |
| 6,093,589 A | 7/2000 | Lo et al. | |
| 6,093,607 A | 7/2000 | Hsieh et al. | |
| 6,093,659 A * | 7/2000 | Grider | H01L 21/26506 257/E21.335 |
| 6,191,463 B1 * | 2/2001 | Mitani | H01L 21/28176 257/410 |
| 6,194,259 B1 * | 2/2001 | Nayak | H01L 21/76237 257/E21.551 |
| 6,432,786 B2 | 8/2002 | Chen et al. | |
| 6,445,030 B1 * | 9/2002 | Wu et al. | 257/315 |
| 6,541,321 B1 | 4/2003 | Buller et al. | |
| 6,593,196 B2 | 7/2003 | Akram et al. | |
| 6,596,570 B2 | 7/2003 | Furukawa | |
| 6,667,509 B1 | 12/2003 | Hsieh et al. | |
| 6,720,213 B1 | 4/2004 | Gambino et al. | |
| 6,825,133 B2 | 11/2004 | Yu et al. | |

(Continued)

*Primary Examiner* — Benjamin Sandvik
*Assistant Examiner* — Herve Assouman
(74) *Attorney, Agent, or Firm* — Amerson Law Firm, PLLC

(57) ABSTRACT

Methods of forming a semiconductor device structure at advanced technology nodes and respective semiconductor device structures are provided at advanced technology nodes, i.e., smaller than 100 nm. In some illustrative embodiments, a fluorine implantation process for implanting fluorine at least into a polysilicon layer formed over a dielectric layer structure is performed prior to patterning the gate dielectric layer structure and the polysilicon layer for forming a gate structure and implanting source and drain regions at opposing sides of the gate structure.

20 Claims, 8 Drawing Sheets

(56) References Cited

U.S. PATENT DOCUMENTS

| | | |
|---|---|---|
| 7,105,411 B1 | 9/2006 | Akram et al. |
| 7,227,230 B2 | 6/2007 | Gambino et al. |
| 7,514,310 B2 | 4/2009 | Kim et al. |
| 7,867,839 B2 | 1/2011 | Chen et al. |
| 7,893,482 B2 | 2/2011 | Kim et al. |
| 8,076,228 B2 | 12/2011 | Berthold et al. |
| 8,232,605 B2 | 7/2012 | Lin et al. |
| 8,828,834 B2 | 9/2014 | Pandey et al. |
| 2003/0124823 A1 | 7/2003 | Jain et al. |
| 2004/0082156 A1* | 4/2004 | Agarwal ........... H01L 21/28061 438/592 |
| 2004/0102013 A1 | 5/2004 | Hwang et al. |
| 2004/0171201 A1 | 9/2004 | Gambino et al. |
| 2005/0106789 A1* | 5/2005 | Gottsche ........... H01L 21/28123 438/163 |
| 2005/0136579 A1 | 6/2005 | Hao et al. |
| 2005/0202659 A1 | 9/2005 | Li et al. |
| 2006/0068575 A1 | 3/2006 | Gluschenkov et al. |
| 2006/0273412 A1 | 12/2006 | Tamura et al. |
| 2007/0155099 A1* | 7/2007 | Takata ............. H01L 29/42332 438/257 |
| 2007/0211541 A1* | 9/2007 | Jung ........................ 365/185.29 |
| 2008/0057654 A1 | 3/2008 | Chen et al. |
| 2008/0067636 A1* | 3/2008 | Shimizu et al. ............... 257/651 |
| 2008/0150006 A1* | 6/2008 | Kwan et al. .................... 257/324 |
| 2008/0157215 A1 | 7/2008 | Miyashita |
| 2009/0090975 A1 | 4/2009 | Ong et al. |
| 2009/0197381 A1 | 8/2009 | Lenski et al. |
| 2009/0278209 A1 | 11/2009 | Noda |
| 2010/0038729 A1* | 2/2010 | Eimori .................... H01L 27/11 257/411 |
| 2010/0096705 A1* | 4/2010 | Hung .................... H01L 21/265 257/411 |
| 2010/0148271 A1* | 6/2010 | Lin ................. H01L 21/823857 257/369 |
| 2011/0127618 A1 | 6/2011 | Scheiper et al. |
| 2011/0147838 A1* | 6/2011 | Gossner ............. H01L 29/7391 257/345 |
| 2011/0269278 A1 | 11/2011 | Hoentschel et al. |
| 2011/0272766 A1 | 11/2011 | Hung et al. |
| 2012/0043593 A1 | 2/2012 | Zhong et al. |
| 2014/0256097 A1 | 9/2014 | Yan et al. |

* cited by examiner

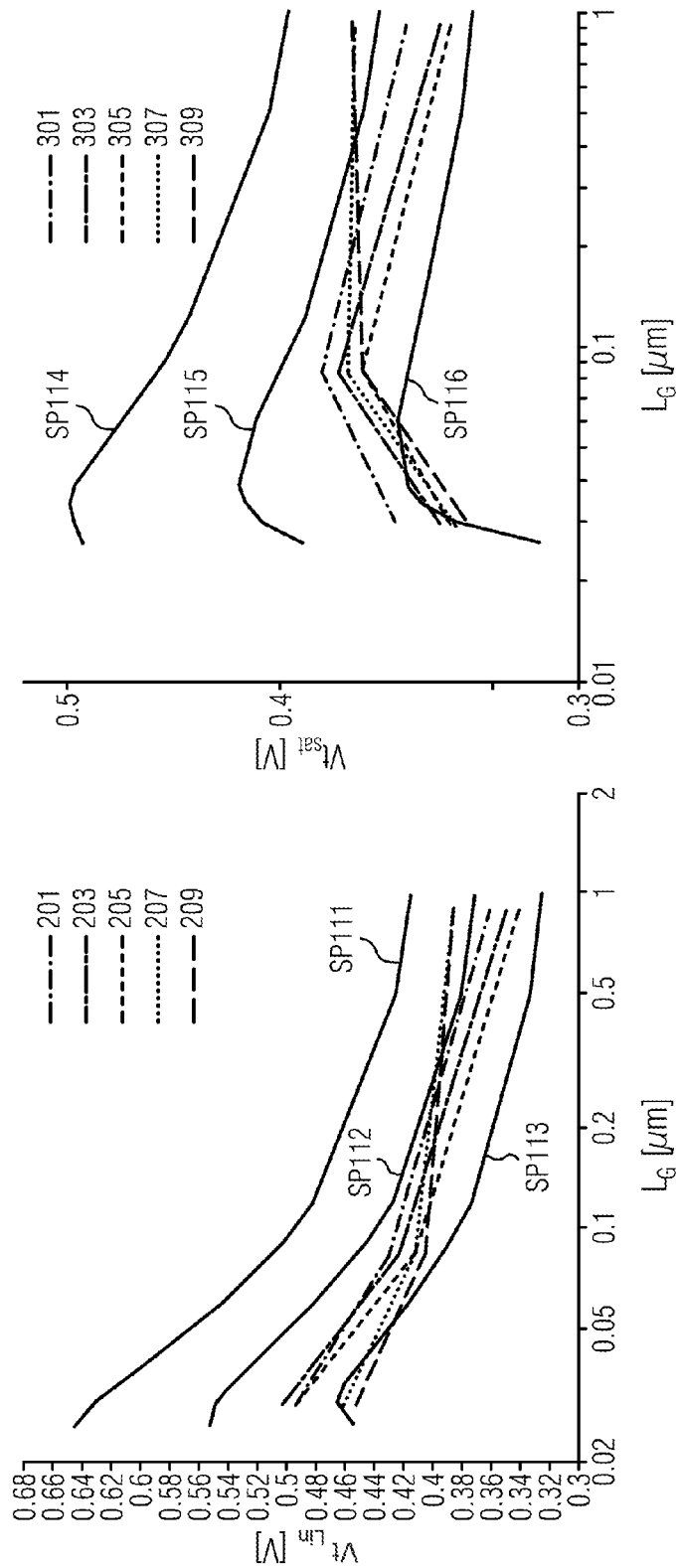

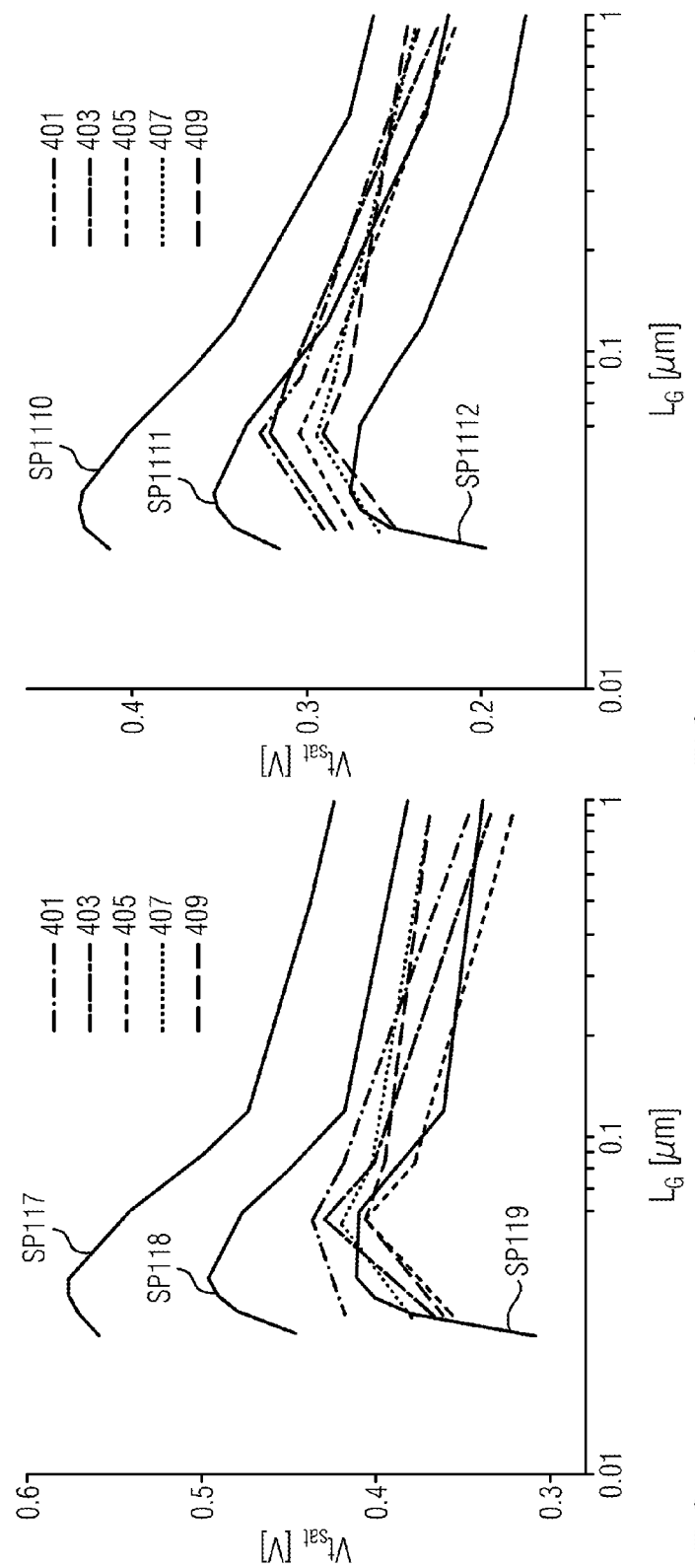

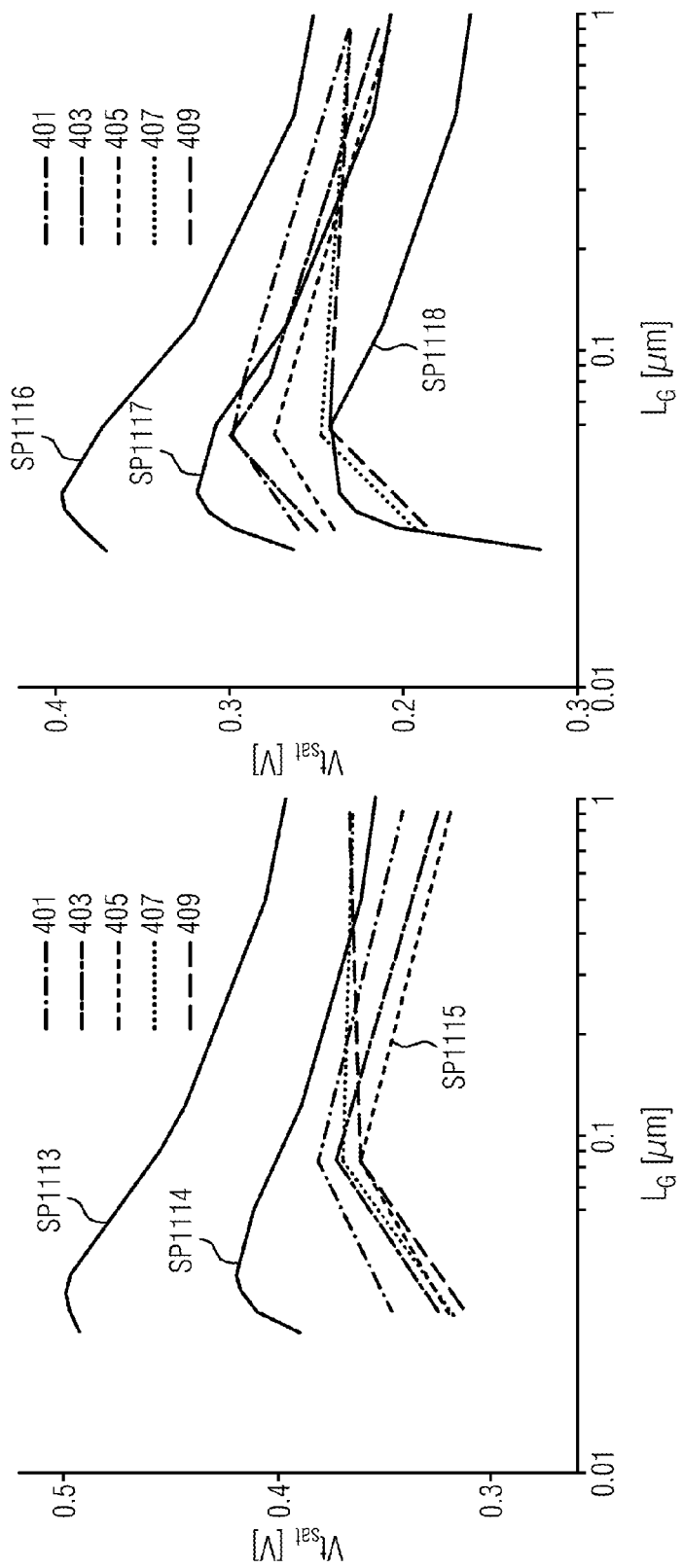

METHOD OF FORMING A SEMICONDUCTOR DEVICE STRUCTURE EMPLOYING FLUORINE DOPING AND ACCORDING SEMICONDUCTOR DEVICE STRUCTURE

BACKGROUND OF THE INVENTION

1. Field of the Invention

The present invention generally relates to integrated circuits, and, more particularly, to semiconductor device structures with gate structures having a fluorine doping profile and methods of forming according semiconductor device structures.

2. Description of the Related Art

The majority of present-day integrated circuits (ICs) are implemented by using a plurality of interconnected field effect transistors (FETs), also called metal oxide semiconductor field effect transistors (MOSFETs) or simply MOS transistors. Typically, present-day integrated circuits are implemented by millions of MOS transistors which are formed on a semiconductor substrate with a given surface area.

Basically, MOS transistors act as electronic switching elements wherein a current through a channel region, formed between source and drain regions of a MOS transistor, is controlled by a gate electrode which is typically disposed over the channel region, independent from whether a PMOS transistor or an NMOS transistor is considered. Particularly, the conductivity state of a transistor is changed by a voltage applied to the gate electrode passing a so-called threshold voltage (Vt). In general, the threshold voltage depends nontrivially on the transistor's properties, such as size, material, etc.

In efforts to build integrated circuits with a greater number of transistors and faster semiconductor devices, developments in semiconductor technologies are directed to ultra large scale integration (ULSI), which resulted in ICs of ever-decreasing size and, therefore, of MOS transistors having reduced sizes. Herein, a critical dimension (CD) is represented by a width or length dimension of a line or space that has been identified as critical to the device under fabrication for operating properly and, furthermore, which dimension determines the device performance. In present-day semiconductor technology, the CDs of microelectronic devices have been approaching the deep sub-micron regime so as to continually meet the demand for faster and also less power-consuming semiconductor devices, so-called low power devices, which allow fabricating advanced microprocessors and digital circuits. In general, it is attempted to provide semiconductor device structures having improved high energy efficiency.

However, as semiconductor devices and device features have become smaller in order to comply with requirements set by advanced integration densities, conventional fabrication techniques have been pushed to their limits, challenging their abilities to produce finely defined features at presently required scales. Consequently, developers are faced with increasing challenges and constraints due to scaling limitations which arise as semiconductor devices continue to decrease in size.

Normally, millions of individual semiconductor devices, such as PMOS transistors or NMOS transistors, are provided on a microchip for implementing IC structures. As transistor performance depends crucially on several factors, for example, on the threshold voltage, it is easy to see that it is highly nontrivial to control a chip's performance. Therefore, controlling a chip's performance generally requires keeping many parameters of individual transistors under control, especially for strongly-scaled semiconductor devices. For example, deviations in the threshold voltage of transistor structures across a semiconductor chip strongly affect the reliability of the whole chip under fabrication. In order to ascertain a reliable controllability of transistor devices across a chip, a well-defined adjustment of the threshold voltage for each transistor has to be maintained to a high degree of accuracy. As the threshold voltage alone already depends on many factors, it is necessary to provide a carefully controlled process flow for fabricating transistor devices which reliably meets all factors.

In practice, fabricated chips are often provided to customers in so-called technology platforms with which many electrical parameters are to be specified as a function of device geometries. In this regard, the dependency of the threshold voltage variation on the device geometry, and particularly on the gate length, is an important example of the parameters to be specified.

FIG. 1 illustrates very schematically a relation between a length of a semiconductor device (L in μm) plotted against the linear threshold voltage ($Vt_{Lin}$ in V). As shown in FIG. 1, scaling down transistor devices in their length dimension induces a roll-up or roll-off of $Vt_{Lin}$. By way of example, when starting from a length dimension of around 1 μm, a $Vt_{Lin}$ roll-up of roughly around 0.1 V may be expected when scaling down to about 72 μm.

It is generally accepted that so-called short channel effects and reverse short channel effects represent an important factor when discussing the dependency of the threshold voltage on the gate length as they become more relevant at smaller scales. Herein, the relative strength of well dosages, halo dosages and the dosages of extension regions in turn may strongly affect the reverse short channel effect. In conventional device engineering, it is attempted to carefully choose implant settings for meeting as much of the device performance criteria as possible, while showing a reasonable behavior for the dependency of the threshold voltage on the gate length. However, this does not allow actively adjusting the dependency of the threshold voltage on the gate length to a desired degree because it is rather a mere consequence of the implant settings as the performance criteria (in a broad sense, covering threshold voltage, on-current, off-current etc.) dominate over possible ranges of the implant settings.

In particular, all devices with different threshold flavors (low-threshold voltage or LVT devices, super-low threshold or SLVT devices, regular threshold voltage or RVT devices and high threshold voltage or HVT devices) in advanced high-k metal gate technologies show reverse short channel effects. In practice, no solution has been proposed for reducing the above-discussed degrading effects without deteriorating the device performance.

This may be understood by considering that although, in theory, a stable and flatter dependency of the threshold voltage on the gate length may be obtained by changing implant settings of well implantation, halo implantation and source/drain extension implantation, it is not possible to simultaneously improve all performance criteria. Therefore, in practice, such approaches only provide limited space for adjustments of the dependency of the threshold voltage on the gate length, mostly on cost of lower device performance.

US Patent Publication 2010/0148271 relates to a method for gate leakage reduction and threshold voltage shift control by implanting fluorine ions into a gate dielectric. This effect is based on the observation that the threshold voltage increases by 6.7 mV when a fluorine implant dosage is increased by $1 \times 10^{15}$ atoms/cm² for NMOS devices (NMOS roll-up), while the threshold voltage of PMOS devices is increased by 20 mV when an implant dosage of fluorine is increased by $1 \times 10^{15}$ atoms/cm² (PMOS roll-up). In the framework of US Patent Publication 2010/0148271, the threshold voltages of PMOS and NMOS devices may be matched by appropriately raising the threshold voltage of PMOS devices relative to NMOS devices.

US Patent Publication 2005/0136579 discloses a method for manufacturing a metal oxide transistor having reduced 1/f noise by implanting a fluorine dopant into a polysilicon layer and diffusing the fluorine dopants into a gate dielectric material layer formed underneath the polysilicon layer by thermal annealing and to subsequently form gate electrodes.

However, these conventional approaches basically raise the threshold voltage, while, for, advanced semiconductor devices, low performance and low power consumption is desired. Therefore, it is desirable to continue in lowering threshold voltages of semiconductor devices at advancing technology nodes.

It is desirable to provide technologies at smaller technology nodes which enable reducing variations in the threshold voltage of semiconductor devices.

It is desirable to provide a method which allows for tuning the dependency of the threshold voltage on the gate length without degrading the rest of the performance indicators. Furthermore, it is desirable to provide semiconductor device structures having a stable and flat dependency of the threshold voltage on the gate length and simultaneously meeting required advanced high device performance criteria.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is generally directed to a method of forming a semiconductor device structure at advanced technology nodes, and the resulting semiconductor device.

In one embodiment of the present disclosure, a method of forming a semiconductor device structure is provided. The method includes forming a gate dielectric layer structure over a surface of a semiconductor substrate, forming a polysilicon layer over the gate dielectric layer structure, performing a fluorine implantation process for implanting fluorine at least into the polysilicon layer, forming a gate structure by patterning the gate dielectric layer structure and the polysilicon layer, and forming source and drain regions at opposing sides of the gate structure, wherein a minimum dimension of the gate structure along a direction extending from the source/drain region to the drain/source region is less than about 100 nm.

In another embodiment of the present disclosure, a method of forming an NMOS device having a gate length smaller than 35 nm is provided, wherein the method includes providing a semiconductor substrate having a boron dopant profile close to a surface thereof, forming a gate dielectric layer structure and a polysilicon layer over the surface, performing a fluorine implantation process for establishing a fluorine dopant profile in the polysilicon, the gate dielectric layer stack and within the semiconductor substrate close to the surface of the substrate, and thereafter forming a gate structure by applying a patterning process to the polysilicon layer and the gate dielectric layer structure.

In a further embodiment of the present disclosure, a semiconductor device structure is provided, the semiconductor device structure including a semiconductor substrate, a gate structure formed over the semiconductor substrate, the gate structure including a gate layer stack and a sidewall spacer structure, wherein the gate layer stack includes a gate dielectric layer and a polysilicon layer, and source and drain regions formed at opposing sides of the gate structure, wherein the gate structure has a fluorine dopant profile substantially formed in the gate layer stack, and wherein a minimum dimension of the gate layer stack along a direction extending from the source/drain region to the drain/source region is less than about 100 nm.

BRIEF DESCRIPTION OF THE DRAWINGS

The disclosure may be understood by reference to the following description taken in conjunction with the accompanying drawings, in which like reference numerals identify like elements, and in which:

FIG. 2 schematically illustrates a graphical representation of linear threshold voltages in dependence on gate length values for low performance NMOS devices of RVT type at different fluorine implantation dosages;

FIG. 3 schematically illustrates a graphical representation of the dependency of threshold saturation voltages of super-low performance NMOS devices of RVT type on the gate length for various fluorine implantation dosages;

FIGS. 4a-4d schematically illustrate graphical representations of the dependency of threshold saturation voltages of super-low performance NMOS devices of HVT, RVT, LVT and SLVT type on the gate length for various fluorine implantation dosages;

Figure 1:
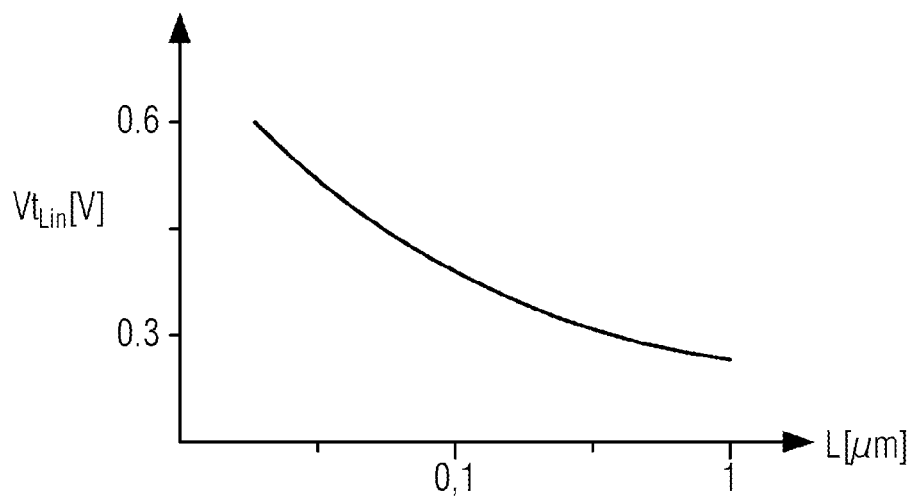
FIG. 1 schematically illustrates a known relation between the linear threshold voltage of conventional semiconductor devices and according gate lengths.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The drawings showing embodiments of the present disclosure are semi-diagrammatic and are not to scale and, particularly, some of the dimensions are for clarity of presentation only and, therefore, are exaggeratedly shown in the figures. Similarly, although the views in the drawings generally show similar orientations for ease of description, this depiction in the figures is arbitrary for the most part. Generally, the embodiments of the disclosure can be operated in any orientation.

The multiple embodiments are disclosed and described having some features in common, for clarity and ease of illustration, description and comprehension thereof, similar and like features are ordinarily described with similar reference numerals as a matter of descriptive convenience. Various different embodiments are described with regard to one or more common figures as a matter of descriptive convenience. It is to be understood that this is not intended to have any other significance or provide any limitation for the present disclosure. Any numeration of embodiments, may it be explicit as $1^{st}$ embodiment, $2^{nd}$ embodiment, etc., or implied, is a matter of descriptive convenience and is not intended to provide any other significance or limitation for the present disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Integrated circuits (ICs) can be designed with millions of transistors. Many ICs are designed using metal oxide semiconductor (MOS) transistors, also known as field effect transistors (FETs) or MOSFETs. Although the term "MOS transistor" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. The person skilled in the art understands that MOS transistors can be fabricated as P-channel MOS transistors or PMOS transistors and as N-channel transistors or NMOS transistors, and both can be fabricated with or without mobility enhancing stressor features or strain-inducing features. The person skilled in the art understands that stress and strain may be described with regard to a tensile modulus. A circuit designer can mix and match device types, using PMOS and NMOS transistors, stressed and unstressed, to take advantage of the best characteristics of each device type as they best suit the circuit being designed.

In describing the following figures, semiconductor device structures and methods for forming a semiconductor device in accordance with various exemplary embodiments of the present disclosure will be illustrated. The described process steps, procedures and materials are to be considered only as exemplary embodiments designed to illustrate to one of ordinary skill in the art, methods for practicing the invention. However, it is to be understood that the invention is not to be limited to these exemplary embodiments. Illustrated portions of semiconductor devices and semiconductor device structures may include only a single MOS structure, although those skilled in the art will recognize that actual implementations of integrated circuits may include a large number of such structures. Various steps in the manufacture of semiconductor devices and semiconductor device structures are well known and so, in the interest of brevity, many conventional steps will only be mentioned briefly herein, or will be omitted entirely without providing the well-known process details.

It is referred back to the schematic illustration in FIG. 1 and the corresponding discussion above. It is to be kept in mind that, even if process flows for fabricating semiconductor devices are stable at a certain scale such that a determined threshold voltage is adjusted when fabricating semiconductor devices at that scale, a mere transfer of the process flow to more advanced technology nodes at smaller scales does not result in semiconductor devices with equivalently controlled threshold voltages at smaller scales. At each scale, strategies must be developed anew to comply with advancing requirements. The inventors understood that good configurations in view of the threshold voltage Vt depending on the gate length L are given by a flat Vt-L-profile relative to products on record representing current semiconductor devices as illustrated by standard sample devices.

In aspects of the present disclosure, it is possible to reduce reverse short channel effects in the threshold voltage of semiconductor devices, preferably (but not exclusively limited to) NMOS devices, by implementing a specific fluorine dopant profile at a specific location in the process flow. In this way, a desired threshold voltage dependency on the gate length is achieved which is, in comparison to conventional variations in the threshold voltage induced by changes in the gate length, considerably flattened without impacting long channel threshold voltage and degrading short channel device performance.

In accordance with illustrative embodiments of the present disclosure, the fluorine concentration at the substrate/gate dielectric interface of semiconductor devices is increased. In accordance with special illustrative embodiments herein, the fluorine implantation is performed after depositing a polysilicon layer as a gate material over a gate dielectric layer structure in process flows for fabricating MOSFET devices. It is believed that high-dosed fluorine at interfaces of substrate and gate dielectric of MOSFET devices precipitate into vacancy fluorine clusters, which suppress interstitial concentration excesses in vicinities of boron impurities which are, for example, often introduced into the substrate of NMOS semiconductor devices in order to form a P-well. The suppressed interstitial concentration excess allows, in turn, reducing thermal diffusion of boron, which results in a positive modification of a boron profile introduced into the substrate starting from the interface down to the relevant part of the device.

FIG. 2 schematically presents results of illustrative measurements performed with super-low performance NMOS devices of RVT type with a width of approximately 900 nm and being subjected to different fluorine implantations. FIG. 2 graphically illustrates a relationship between linear threshold voltage $Vt_{Lin}$ and gate length $L_G$. Several measurements were performed at different gate lengths. Herein, a curve denoted by reference numeral 201 was obtained by measuring $Vt_{Lin}$ versus $L_G$ with a conventional semiconductor device serving as a standard sample device, particularly without a fluorine profile. A curve denoted by reference numeral 203 corresponds to measurements performed to semiconductor devices that were exposed to a fluorine implantation into polysilicon with a dosage of about $2 \times 10^{15}$ atoms/cm². A curve denoted by reference numeral 205 corresponds to semiconductor devices subjected to a fluorine implantation into polysilicon with a dosage of about $2 \times 10^{15}$ atoms/cm². A curve denoted by reference numeral 207 corresponds to semiconductor devices subjected to a fluorine implantation with a dosage of about $3 \times 10^{15}$ atoms/cm². A curve denoted by reference numeral 209 corresponds to semiconductor devices subjected to a fluorine implantation into polysilicon with a dosage of about $3.5 \times 10^{15}$ atoms/cm².

It is shown by FIG. 2 that, when increasing the fluorine implantation dosage for semiconductor device structures with gate lengths on the order of 1 µm, the linear threshold voltage $Vt_{Lin}$ is substantially increased (agrees with basic understanding as discussed with regard to FIG. 1). This is, however, not the case for semiconductor device structures with gate lengths at about 30 nm or less, where the linear threshold voltage $Vt_{Lin}$ surprisingly decreases with increasing fluorine implantation dosages relative to the standard sample device. When comparing portions of the curves 201 to 209 for semiconductor device structures with gate lengths at about 100 nm and portions of the curves 201 to 209 for semiconductor device structures with gate lengths at about 30 nm, it is easy to see that, for example, an inclination of curve 209 (corresponding to semiconductor device structures with fluorine dosages of $3.5 \times 10^{15}$ atoms/cm²) is less than an inclination of curve 201 denoting standard sample devices for gate length smaller than 100 nm. Curves SP111, SP112, SP113 represent curves that were obtained in accordance with the Spice Model based on the actual silicon.

The person skilled in the art, therefore, appreciates from the representation in FIG. 2 that, for semiconductor device structures having gate lengths smaller than 100 nm, the dependency of the linear threshold voltage on the gate length $Vt_{Lin}(L_G)$ is flattened such that variations of the linear threshold voltage caused by changes in the gate length are reduced.

FIG. 3 graphically illustrates a graphical representation obtained by the inventors performing measurements with super-low performance NMOS devices of the RVT type measuring the saturation threshold voltage $Vt_{SAT}$ at different gate lengths $L_G$. Herein, a curve denoted by reference numeral 301 was obtained by measuring $Vt_{Lin}$ versus $L_G$ with a conventional semiconductor device serving as a standard sample device, particularly without a fluorine profile. A curve denoted by reference numeral 303 corresponds to measurements performed to semiconductor devices that were exposed to a fluorine implantation into polysilicon with a dosage of about $2 \times 10^{15}$ atoms/cm². A curve denoted by reference numeral 305 corresponds to semiconductor devices subjected to a fluorine implantation into polysilicon with a dosage of about $2 \times 10^{15}$ atoms/cm². A curve denoted by reference numeral 307 corresponds to semiconductor devices subjected to a fluorine implantation with a dosage of about $3 \times 10^{15}$ atoms/cm². A curve denoted by reference numeral 309 corresponds to semiconductor devices subjected to a fluorine implantation into polysilicon with a dosage of about $3.5 \times 10^{15}$ atoms/cm². Curves SP114, SP115, SP116 represent curves that were obtained in accordance with the Spice Model based on the actual silicon.

The person skilled in the art appreciates that the effect of obtaining a sufficient flattening of the threshold voltage depending on the gate length is present for both, $Vt_{Lin}$ and $Vt_{SAT}$, at a dosage of about $3.5 \times 10^{15}$ atoms/cm² or more.

FIGS. 4a-4d graphically illustrate dependencies of $Vt_{SAT}$ on the gate length $L_G$ for different Vt flavors, such as HVT devices (FIG. 4a), LVT devices (FIG. 4b), RVT devices (FIG. 4c) and SLVT devices (FIG. 4d). Herein, curves denoted by reference numeral 401 were obtained by measuring $Vt_{Lin}$ versus $L_G$ with conventional semiconductor devices serving as a standard sample devices, particularly without a fluorine profile. Curves denoted by reference numeral 403 correspond to measurements performed to semiconductor devices that were exposed to a fluorine implantation into polysilicon with a dosage of about $2 \times 10^{15}$ atoms/cm². Curves denoted by reference numeral 405 correspond to semiconductor devices subjected to a fluorine implantation into polysilicon with a dosage of about $2 \times 10^{15}$ atoms/cm². Curves denoted by reference numeral 407 correspond to semiconductor devices subjected to a fluorine implantation with a dosage of about $3 \times 10^{15}$ atoms/cm². Curves denoted by reference numeral 409 correspond to semiconductor devices subjected to a fluorine implantation into polysilicon with a dosage of about $3.5 \times 10^{15}$ atoms/cm². Curves SP117-SP1118 represent curves that were obtained in accordance with the Spice Model based on the actual silicon.

Basically, the dependency of $Vt_{SAT}$ on changes in the gate length $L_G$ is less pronounced with decreasing fluorine implantation dosage, as can be derived from FIGS. 4a-4d. Particularly, it is confirmed for each of the different Vt flavors and according NMOS devices, respectively, that, for semiconductor devices with a gate length of about 1 µm, the threshold voltage is substantially increased with increased fluorine implantation dosage. In reducing the gate length down to 100 nm or less, and particularly to about 30 nm or less, the tendency is such that $Vt_{SAT}$ substantially decreases with increasing fluorine implantation dosage. FIGS. 4a-4d, therefore, show that the present disclosure provides a general technique valid for all NMOS devices and Vt flavors.

Figure 5A:
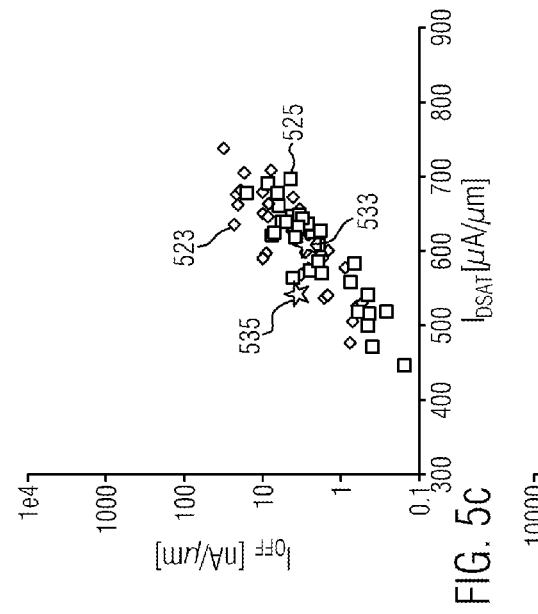
FIGS. 5a-5d schematically illustrate graphical representations of universal curves of super-low performance NMOS devices of HVT, RVT, LVT and SLVT type for various fluorine implantation dosages.
Figure 5C:
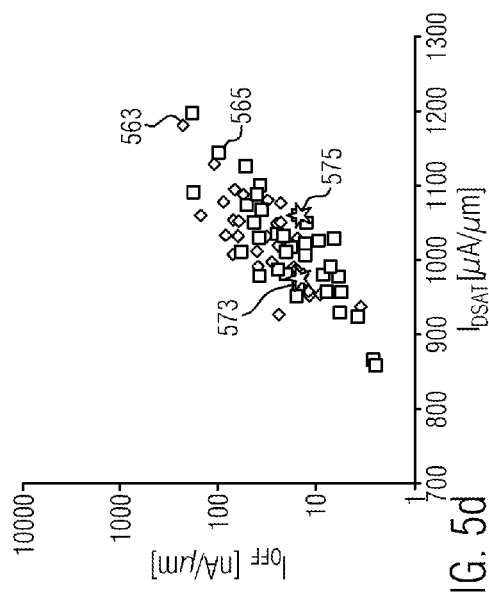
Figure 5B:
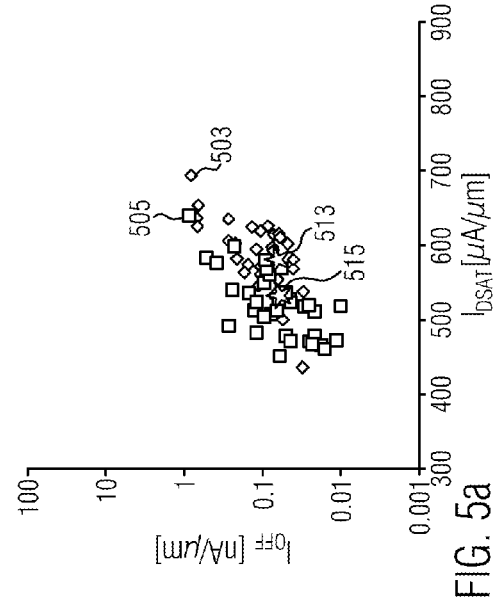
Figure 5D:
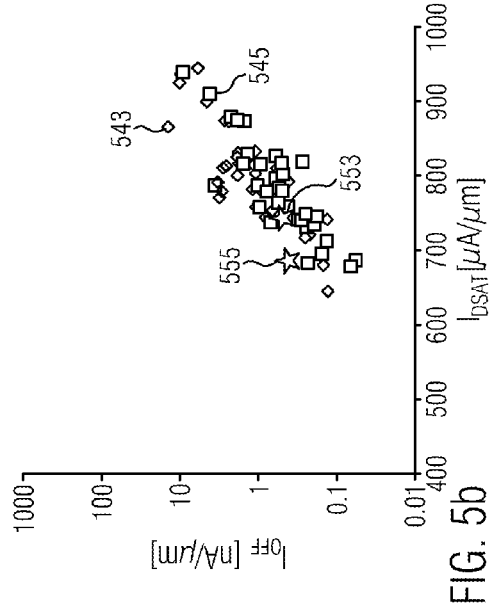

FIGS. 5a-5d graphically represent results of measurements of HVT, LVT, RVT and SLVT type NMOS devices subjected to a fluorine implantation in comparison to conventional semiconductor devices acting as standard sampling devices (square-shaped measurement points 505 in FIG. 5a, 545 in FIG. 5b, 525 in FIG. 5c, 565 in FIG. 5d). The fluorine implantation dosage was chosen to be about $3.5 \times 10^{15}$ atoms/cm² (diamond-shaped measurement points 503 in FIG. 5a, 543 in FIG. 5b, 523 in FIG. 5c, 563 in FIG. 5d). Furthermore, the measurements were performed with semiconductor devices having a gate length less than 35 nm, particularly with gate lengths of 26 nm, 30 nm and 34 nm. Each of the graphs illustrated in FIGS. 5a-5d shows different measurement points of $I_{OFF}$ versus $I_{DSAT}$ normalized to different gate lengths. Average values of the square-shaped measurement points are indicated by stars (reference numeral 515 in FIG. 5a, reference numeral 555 in FIG. 5b, reference numeral 535 in FIG. 5c, reference numeral 573 in FIG. 5d). Averaged values of the diamond-shaped measurement points are indicated by stars (reference numeral 513 in FIG. 5a, reference numeral 553 in FIG. 5b, reference numeral 533 in FIG. 5c, reference numeral 575 in FIG. 5d). By introducing fluorine into polysilicon with an implantation dosage of $3.5 \times 10^{15}$ atoms/cm$^2$, drain saturation current $I_{DSAT}$ is increased and/or off-current $I_{OFF}$ is decreased. Therefore, the graphical representations in FIG. 5a-5d show that, for all different NMOS types, with and without fluorine implantation profile, the same performance may be expected, if not an improved performance may be achieved.

With regard to FIGS. 6a-6e, various illustrative embodiments of the present disclosure will be described with regard to methods of forming semiconductor device structures having reduced variations of the threshold voltage upon changes in the gate length as compared to conventional semiconductor devices.

Figure 6A:
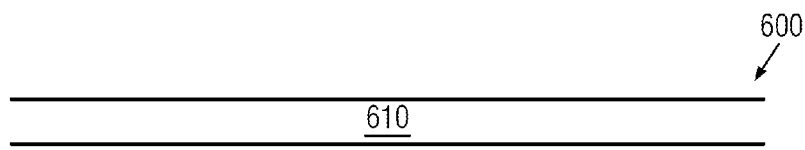
FIGS. 6a-6e schematically illustrate in cross-sectional views a method of forming a semiconductor device structure in accordance with an illustrative embodiment of the present disclosure.

FIG. 6a illustrates a semiconductor device structure 600 at an early stage of fabrication, wherein the semiconductor device structure 600 comprises a silicon substrate 605 and a gate dielectric layer structure 610 formed over the semiconductor substrate 605. The semiconductor substrate 605 may be a bulk substrate or may be implemented by a silicon-on-insulator (SOI) configuration. The gate dielectric layer structure 610 may be comprised of one or more dielectric material layers of materials such as a silicon oxide material, a silicon nitride material, high-k dielectric materials and combinations thereof.

Figure 6B:
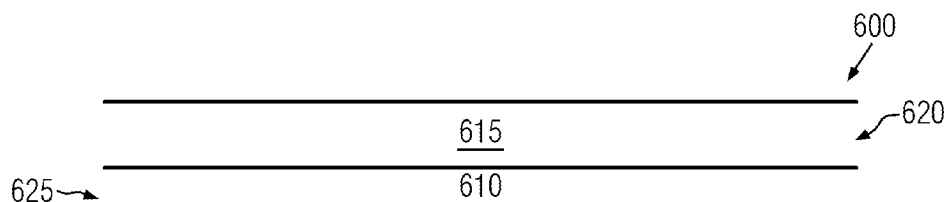

FIG. 6b illustrates the semiconductor device structure 600 of FIG. 6a at a more advanced stage during fabrication. A gate material layer 615, for example formed by polysilicon or another conventional gate material, is formed over the gate dielectric layer structure 610. In an illustrative example herein, the gate material layer 115 is deposited on the gate dielectric layer structure 610 by conventional procedures, such as low pressure chemical vapor deposition (LPCVD) and the like. The gate material layer 615 has a thickness 620 which may be selected with respect to settings of a fluorine implantation process to be performed at a later stage in order to prevent fluorine from being implanted directly into the gate dielectric layer structure 610 and thereby damaging the crystal structure of the gate dielectric layer structure. This is particularly relevant when high-k materials are present in the gate dielectric layer structure, such as in so called "gate-first" technologies. In certain preferred embodiments, therefore, the gate material layer 615 has a minimum thickness 620 of at least about 50 nm, preferably about 100 nm, and more preferably about 150 nm. The person skilled in the art will appreciate that the gate dielectric layer structure 605 may have a thickness in the range of about 1-50 nm. Of course, one skilled in the art would understand that the thicknesses 620 and 625 and the use of implantation energies during the fluorine implantation step to be performed at a later stage can be cooperatively adjusted to ensure that fluorine is implanted only into the polysilicon layer 615 in order to avoid any damages of the gate dielectric layer structure 610, if required.

Figure 6C:
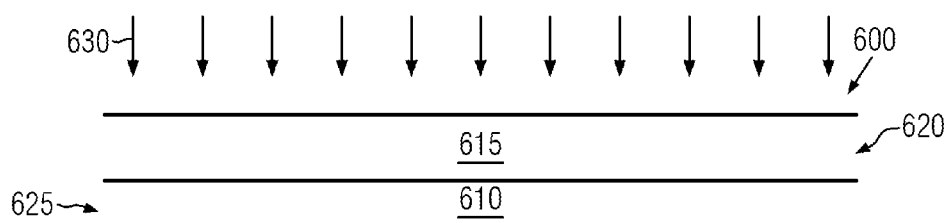

FIG. 6c illustrates the partially completed semiconductor device structure 600 while implanting fluorine dopants at least into the polysilicon layer 615 during a fluorine implantation process 630. In illustrative examples herein, the dopants may be composed of fluorine or boron fluorides, such as boron difluoride $BF_2+$, boron trifluoride or mixtures thereof.

In some special illustrative embodiments, the fluorine dopants may be implanted at a dose and energy such that no fluorine is directly implanted into the gate dielectric layer structure 610. In accordance with illustrative examples herein, the fluorine dose may be of at least about $3\times10^{15}$ atoms/cm$^2$. In accordance with special illustrative examples herein, the fluorine implant dose may be in a range of about $3\times10^{15}$ atoms/cm$^2$ to about $5\times10^{15}$ atoms/cm$^2$.

In some special illustrative embodiments herein, acceleration energies may be chosen in between about 1-100 keV, depending on implant species and the like. In a special illustrative example herein, the acceleration energies may be chosen out of the range from about 1-50 keV. In a preferred example, the acceleration energies may be chosen out of the range from about 1-25 keV. In a more preferred example, the acceleration energies may be chosen out of the range from about 5-20 keV.

Figure 6D:
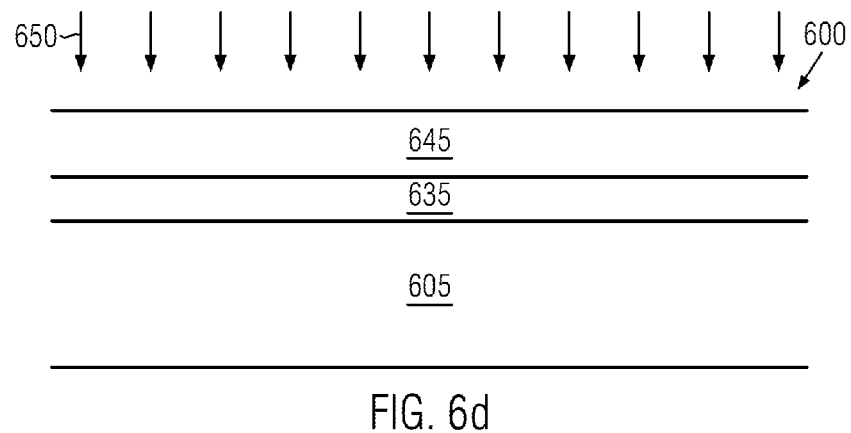

FIG. 6d illustrates the semiconductor device structure 600 at a more advanced stage during fabrication, wherein fluorine is at least implanted into the polysilicon layer 615 (see FIG. 6c) resulting in a fluorine implanted polysilicon 645. Alternatively, fluorine may be as well implanted into the gate dielectric layer structure 610 (see FIG. 6c) to result in a fluorine implanted gate dielectric layer structure 635. The person skilled in the art appreciates that, in accordance with some illustrative embodiments, polysilicon 645 may be disposed over gate dielectric 610 (not illustrated). Alternatively, polysilicon 645 may be disposed over gate dielectric layer structure 635.

Figure 6E:
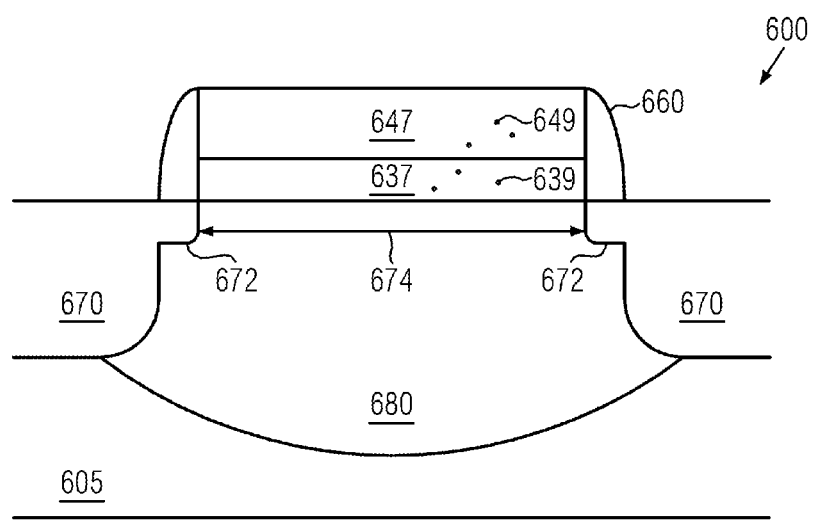

As illustrated, after having performed the fluorine implantation process 630 (FIG. 6c), a patterning process 650 may be applied to the semiconductor device structure 600 as shown in FIG. 6d in order to form a gate electrode structure (FIG. 6e). The person skilled in the art will appreciate that the patterning process 650 may, by way of example, comprise appropriate steps of depositing a masking layer, patterning the masking layer, performing appropriate etching steps through the masking layer, removing the masking layer, and the like.

As illustrated in FIG. 6e, additional conventional procedures can be performed to form other device components, including a doped well 680, source and drain regions 670, source and drain extension regions 672 and sidewall spacer structures 660 covering sidewalls of a gate electrode layer stack comprised of a gate dielectric layer structure 637 and a gate material 647. The gate material 647 may correspond to the fluorine doped polysilicon material 645 (FIG. 6d) having fluorine impurities 649 (for ease of illustration, only schematically depicted) therein. In a special illustrative embodiment herein, the gate dielectric layer structure 637 may have fluorine impurities 639 incorporated therein. However, this does not pose any limitation on the present disclosure and the person skilled in the art will appreciate that the gate dielectric layer structure 637 may alternatively not have fluorine impurities 639 incorporated therein (not illustrated). The person skilled in the art will appreciate that semiconductor device structures as illustrated in FIG. 6e may have a gate length (indicated by double arrow 674) in the range of 100 nm or less, preferably in the range of 50 nm or less, more preferably in the range of 35 nm or less.

The present disclosure proposes an additional fluorine implantation starting from gate material layer formation, such as a poly deposition step, up to formation of source and drain (therefore after gate patterning) prior to a final annealing sequence which may be performed for activating dopants, such as source/drain and/or halo dopants, healing of crystal damages, etc. The person skilled in the art will appreciate that preferably no high thermal budget is applied during these process steps or sequences. For example, only relatively cold spacer formations with temperatures equal to or below 800° C., preferably 600° C., are applied before forming source and drain regions and preferably prior to the final anneal.

The person skilled in the art will appreciate that a boron implantation process (not illustrated) may be performed prior to the implantation process 630 in FIG. 6c when NMOS device structures are considered. In illustrative embodiments herein, a boron profile may be formed within the semiconductor substrate 605 prior to forming the gate dielectric layer structure 610.

In illustrative embodiments, a semiconductor device under fabrication, such as a semiconductor device comprising at least one semiconductor device structure 600 as described with regard to the FIGS. 6a-6e, may comprise a low threshold voltage NMOS device and/or a super low threshold voltage NMOS device and/or a regular threshold voltage NMOS device and/or a high threshold voltage NMOS device.

Figure 7:
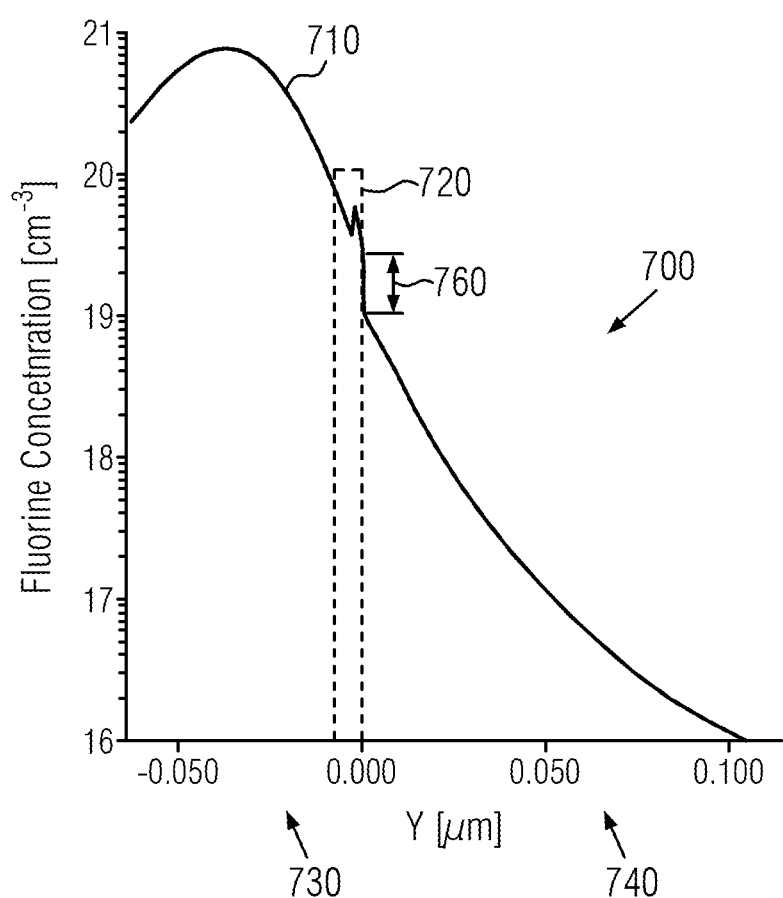
FIG. 7 schematically illustrates a graphical representation of the fluorine dopant profile in a region of a gate electrode in accordance with an illustrative embodiment of the present disclosure.

FIG. 7 schematically illustrates a fluorine profile in accordance with a special illustrative embodiment of the present disclosure. Particularly, a graph 710 represents a dependency of a fluorine concentration on a distance Y measured relative to an interface of a gate dielectric layer structure 720 to an underlying semiconductor substrate 740. On the left of the gate dielectric layer structure 720, the gate material 730 is represented. Therefore, the concentration profile as illustrated in FIG. 7 corresponds to a profile of fluorine impurities taken along a section of a gate electrode of the present disclosure along its height direction (the height direction is defined as being oriented in parallel to a normal direction of a surface of a semiconductor substrate over which the gate material is disposed). As illustrated in FIG. 7, a maximum of the fluorine concentration on the order of about $10^{21}$ atoms/$cm^3$ is located at about 50 nm or less from the interface. Within the gate dielectric layer structure 720, the concentration of fluorine impurities may be on the order of about $10^{20}$ atoms/$cm^3$ or less and higher than the order of about $10^{19}$ atoms/$cm^3$. At the interface, a drop in the fluorine concentration, indicated by double-arrow 760, is present.

The person skilled in the art will appreciate that the fluorine concentration profile in the gate dielectric layer structure 720 and at the interface suggests that fluorine precipitates into vacancy fluorine clusters as explained above.

The present disclosure provides, in various aspects, methods of forming a semiconductor device structure at advanced technology nodes and respective semiconductor device structures are provided at advanced technology nodes, i.e., smaller than 100 nm. In some illustrative embodiments, a fluorine implantation process for implanting fluorine at least into a polysilicon layer formed over a dielectric layer structure is performed prior to patterning the gate dielectric layer structure and the polysilicon layer for forming a gate structure and implanting source and drain regions at opposing sides of the gate structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device structure, comprising:
    forming a gate dielectric layer structure over a surface of a semiconductor substrate;
    forming a polysilicon layer over said gate dielectric layer structure;
    performing a fluorine implantation process on said polysilicon layer, wherein fluorine is implanted at least into said polysilicon layer and said gate dielectric layer structure during said fluorine implantation process;
    forming a gate structure by patterning said gate dielectric layer structure and said polysilicon layer; and
    forming source and drain regions at opposing sides of said gate structure;
    wherein a minimum dimension of said gate structure along a direction extending from a source/drain region on one side of said gate structure to a drain/source region on the other side of said gate structure is less than about 100 nm.

2. The method of claim 1, wherein said fluorine implantation process comprises a fluorine implantation step having a dose greater than about $2 \times 10^{15}$ atoms/$cm^2$.

3. The method of claim 2, wherein said dose is about $3 \times 10^{15}$ atoms/$cm^2$.

4. The method of claim 1, wherein said minimum dimension is smaller than about 50 nm.

5. The method of claim 4, wherein said minimum dimension is smaller than about 35 nm.

6. The method of claim 1, wherein said gate dielectric layer structure comprises at least one of a high-k dielectric material and a silicon oxide material and a work function adjusting material.

7. The method of claim 1, further comprising performing a boron implantation process prior to performing said fluorine implantation process.

8. The method of claim 7, wherein said boron implantation process is performed prior to forming said gate dielectric layer structure.

9. The method of claim 1, wherein said semiconductor device structure is exposed to temperatures substantially less than about 800° C. prior to formation of said source and drain regions.

10. A method of forming an NMOS device having a gate length smaller than 35 nm, comprising:
    providing a semiconductor substrate having a boron dopant profile close to a surface thereof;
    forming a gate dielectric layer structure and a polysilicon layer over said surface;
    performing a fluorine implantation process on said polysilicon layer for establishing a fluorine dopant profile in said polysilicon layer, said gate dielectric layer structure and within said semiconductor substrate adjacent to said surface of said substrate, wherein fluorine is implanted into said polysilicon layer and said gate dielectric layer structure during said fluorine implantation process; and thereafter
    forming a gate structure by applying a patterning process to said polysilicon layer and said gate dielectric layer structure.

11. The method of claim 10, wherein said fluorine implantation process has an implantation energy selected such that a maximum of said fluorine dopant profile is formed close to an interface of said polysilicon layer and said gate dielectric layer structure.

12. The method of claim 10, wherein a fluorine concentration within said gate dielectric layer structure is greater than a fluorine concentration within said substrate.

13. The method of claim 10, wherein fluorine is implanted into said polysilicon layer and said gate dielectric layer structure during said fluorine implantation process.

14. The method of claim 1, wherein fluorine is implanted into said gate dielectric layer structure during said fluorine implantation process.

15. A method, comprising: forming a gate dielectric layer structure above a surface of a semiconductor substrate; forming a polysilicon layer over said gate dielectric layer structure; performing an implantation process to implant fluorine into at least said polysilicon layer and said gate dielectric layer structure during said fluorine implantation process; and patterning said polysilicon layer and said gate dielectric layer structure to form a gate structure, where a gate length of said gate structure is less than approximately 100 nm.

16. The method of claim 15, wherein said gate length of said gate structure is less than approximately 50 nm.

17. The method of claim 15, wherein said gate length of said gate structure is less than approximately 35 nm.

18. The method of claim 15, wherein said gate structure is formed prior to performing said implantation process.

19. The method of claim 15, wherein a fluorine concentration in said polysilicon layer is greater than a fluorine concentration in said gate dielectric layer structure.

20. The method of claim 15, wherein a fluorine concentration in said gate dielectric layer structure is greater than a fluorine concentration in said semiconductor substrate.

\* \* \* \* \*